(12) United States Patent
Radzinski et al.

(10) Patent No.: US 10,709,024 B1
(45) Date of Patent: Jul. 7, 2020

(54) LOW-COST SMT PRINTED CIRCUIT BOARD CONNECTOR

(71) Applicant: UNIVERSAL LIGHTING TECHNOLOGIES, INC., Madison, AL (US)

(72) Inventors: Christopher Radzinski, Huntsville, AL (US); Donald Folker, Madison, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 0 days.

(21) Appl. No.: 16/778,887

(22) Filed: Jan. 31, 2020

Related U.S. Application Data

(60) Provisional application No. 62/869,052, filed on Jul. 1, 2019.

(51) Int. Cl.
| | |
|---|---|
| H05K 3/36 | (2006.01) |
| H05K 1/14 | (2006.01) |
| H01R 12/52 | (2011.01) |
| H05K 3/34 | (2006.01) |

(52) U.S. Cl.
CPC .......... *H05K 3/368* (2013.01); *H01R 12/523* (2013.01); *H05K 3/3426* (2013.01)

(58) Field of Classification Search
CPC .......... H05K 3/368; H05K 3/403; H05K 1/14; H05K 1/142; H05K 1/145; H05K 1/1451; H05K 7/1417; H05K 12/523
See application file for complete search history.

(56) References Cited

U.S. PATENT DOCUMENTS

| | | | | |
|---|---|---|---|---|
| 4,742,183 | A * | 5/1988 | Soloway | H05K 1/148 174/254 |
| 7,203,074 | B1 * | 4/2007 | Yaung | H05K 1/142 29/830 |
| 9,172,165 | B1 * | 10/2015 | Sass | H05K 1/141 |
| 2005/0189640 | A1 * | 9/2005 | Grundy | H01L 23/13 257/686 |
| 2007/0197056 | A1 * | 8/2007 | Huang | G06F 1/185 439/74 |
| 2009/0289717 | A1 * | 11/2009 | Tanaka | H03F 1/0261 330/277 |
| 2010/0085130 | A1 * | 4/2010 | Margomenos | H01P 5/04 333/33 |

(Continued)

*Primary Examiner* — Hoa C Nguyen
(74) *Attorney, Agent, or Firm* — Patterson Intellectual Property Law, P.C.; Gary L. Montle; Jerry Turner Sewell

(57) ABSTRACT

An interconnection system includes a first support surface positionable against a respective first surface of a first printed circuit board (PCB) and a second support surface positionable against a respective first surface of a second PCB. The first PCB has a respective second surface spaced apart from the respective first surface by a first thickness. The second PCB has a respective second surface spaced apart from the respective first surface by a second thickness. A separator extends from the first support surface and from the second support surface. A contact pin extends through the separator. A portion of the contact pin extending in first direction from the separator is spaced apart from the first support surface by a distance corresponding to the first thickness. A portion of the contact pin extending in a second direction from the separator is spaced apart from the second support surface by the second thickness.

15 Claims, 12 Drawing Sheets

(56) References Cited

U.S. PATENT DOCUMENTS

| | | | |
|---|---|---|---|
| 2013/0005190 A1* | 1/2013 | Blanchfield | H01R 12/721 439/630 |
| 2014/0299893 A1* | 10/2014 | Weng | H01L 33/62 257/88 |
| 2016/0049741 A1* | 2/2016 | Cassin | H05K 3/36 439/507 |
| 2016/0079696 A1* | 3/2016 | Krishnamoorthy | H01R 12/732 439/81 |
| 2016/0079841 A1* | 3/2016 | Yeh | H02K 53/00 310/74 |
| 2019/0252810 A1* | 8/2019 | Holec | H01R 12/721 |

* cited by examiner

# LOW-COST SMT PRINTED CIRCUIT BOARD CONNECTOR

CROSS-REFERENCE TO RELATED APPLICATION

This application claims the benefit under 35 USC. § 119(e) of U.S. Provisional Application No. 62/869,052, filed Jul. 1, 2019, entitled "Low Cost SMT Printed Circuit Board Connector," which is hereby incorporated by reference in its entirety.

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

FIELD OF THE INVENTION

The present disclosure relates generally to printed circuit boards and, more particularly, to systems and methods for interconnecting printed circuit board.

BACKGROUND

Printed circuit boards are used to mount and interconnect electronic components to form an electronic circuit. Printed circuit boards are available in many sizes and with varying degrees of complexity. Often, printed circuit boards are electrically and mechanically interconnected to couple power and signals between two printed circuit boards. Printed circuit boards may be electrically and mechanically interconnected by providing a first connector on a first printed circuit board and a second connector on a second printed circuit board. The first and second connectors may have mating features (e.g., plugs on one connector and sockets on the other connector) such that the two printed circuit boards are mechanically and electrically connected when the two connectors are mated. Such connectors add extra costs to the two printed circuit boards and must be precisely mounted to assure that the mating elements of the two connectors are properly aligned. The connectors also increase the size of the printed circuit boards by extending from the edges of the printed circuit boards or by extending above or below the surfaces of the printed circuit boards.

Jumper wires may be used as a less expensive alternative to mating connectors to interconnect two printed circuit boards. Each jumper wire may extend from a mounting pad on a first printed circuit board to a mounting pad on a second printed circuit board. The ends of the jumper wires are soldered to the mounting pads to provide the electrical connections between the two printed circuit boards. Although satisfactory for some applications, the jumper wires are difficult to install on printed circuit boards using automated technology. Furthermore, the flexible, small diameter jumper wires provide little, if any, mechanical interconnection integrity between two printed circuit boards that are positioned edge-to-edge. Additional mechanical interconnections between the two printed circuit boards may be required to maintain the two printed circuit boards in a fixed mechanical relationship.

SUMMARY

A need exists for a low-cost system and method to mechanically and electrically interconnect two printed circuit boards without using connectors or jumper wires.

One aspect in accordance with the embodiments disclosed herein is an interconnection system that includes a first support surface positionable against a respective first surface of a first printed circuit board (PCB) and a second support surface positionable against a respective first surface of a second PCB. The first PCB has a respective second surface spaced apart from the respective first surface by a first thickness. The second PCB has a respective second surface spaced apart from the respective first surface by a second thickness. A separator extends from the first support surface and from the second support surface. A contact pin extends through the separator. A portion of the contact pin extending in first direction from the separator is spaced apart from the first support surface by a distance corresponding to the first thickness. A portion of the contact pin extending in a second direction from the separator is spaced apart from the second support surface by the second thickness.

Another aspect in accordance with the embodiments disclosed herein is a method of interconnecting a first printed circuit board (PCB) and a second PCB. Each PCB has a respective first surface, a respective second surface and a respective thickness between the respective first surface and the respective second surface. The method comprises positioning a separator of an interconnection device between the first PCB and the second PCB. The separator has a longitudinal thickness selected to space the first PCB and the second PCB apart longitudinally by a selected spacing distance. The separator extends perpendicularly from a first longitudinal engagement surface and a second longitudinal engagement surface of the interconnection device. The separator supports at least a first contact pin extending longitudinally through the separator. The first contact pin has a respective first portion spaced apart from the first longitudinal engagement surface by a first gap distance selected to correspond to the respective thickness of the first PCB. The first contact pin has a respective second portion spaced apart from the second longitudinal engagement surface by a second gap distance selected to correspond to the respective thickness of the second PCB. The method further comprises positioning the first longitudinal engagement surface against the respective second surface of the first PCB with a respective portion of the first PCB positioned between the respective first portion of the first contact pin and the first longitudinal engagement surface of the separator. The method further comprises positioning the second longitudinal engagement surface against the respective second surface of the second PCB with a respective portion of the second PCB positioned between the respective second portion of the first contact pin and the second longitudinal engagement surface of the separator. The method further comprises securing the respective first portion of the first contact pin to a respective first mounting pad on the respective first surface of the first PCB. The method further comprises securing the respective second portion of the first contact pin to a respective first mounting pad on the respective first surface of the second PCB.

In certain embodiments in accordance with this aspect, the respective first portion of the first contact pin is secured to the respective first mounting pad of the first PCB by soldering, and the respective second portion of the first contact pin is secured to the respective first mounting pad of the second PCB by soldering.

In certain embodiments in accordance with this aspect, the respective thickness of the first PCB and the respective thickness of the second PCB are substantially equal, and the first gap distance is substantially equal to the second gap distance.

In certain embodiments in accordance with this aspect, the separator supports a second contact pin extending longitudinally through the separator. The second contact pin is parallel to the first contact pin. The second contact pin has a respective first portion spaced apart from the first longitudinal engagement surface by the first gap distance and has a respective second portion spaced apart from the second longitudinal engagement surface by the second gap distance. The method further includes securing the respective first portion of the second contact pin to a respective second mounting pad on the respective first surface of the first PCB, and securing the respective second portion of the second contact pin to a respective second mounting pad on the respective first surface of the second PCB. In certain embodiments in accordance with this aspect, the respective first portion of the second contact pin is secured to the respective second mounting pad of the first PCB by soldering, and the respective second portion of the second contact pin is secured to the respective second mounting pad of the second PCB by soldering. In certain embodiments in accordance with this aspect, the respective thickness of the first PCB and the respective thickness of the second PCB are substantially equal, and the first gap distance is substantially equal to the second gap distance.

Another aspect in accordance with the embodiments disclosed herein is an interconnection device to connect a first printed circuit board (PCB) to a second PCB. Each PCB has a respective first surface and a respective second surface. Each PCB having a respective thickness between the respective first surface and the respective second surface. The interconnection device comprises a support platform having a first engagement surface configured to engage the second surface of the first PCB and having a second engagement surface configured to engage the second surface of the second PCB. The interconnection device further comprises a separator extending from the first engagement surface and from the second engagement surface. The separator has a first separator surface perpendicular to the first engagement surface and has a second separator surface perpendicular to the second engagement surface. The first separator surface and the second separator surface are spaced apart by a separation distance. The interconnection device further comprises at least a first contact pin extending longitudinally through the separator. A respective first portion of the first contact pin extends from the first separator surface. A respective second portion of the first contact pin extends from the second separator surface. The respective first portion of the first contact pin is spaced apart from the first engagement surface by a first gap distance selected to correspond to the respective thickness of the first PCB. The respective second portion of the first contact pin is spaced apart from the second engagement surface by a second gap distance selected to correspond to the respective thickness of the second PCB.

In certain embodiments in accordance with this aspect, the interconnection device further comprises a second contact pin extending longitudinally through the separator. The second contact pin is parallel to the first contact pin. A respective first portion of the second contact pin extends from the first separator surface. A respective second portion of the second contact pin extends from the second separator surface. The respective first portion of the second contact pin is spaced apart from the first engagement surface by the first gap distance. The respective second portion of the second contact pin is spaced apart from the second engagement surface by the second gap distance.

In certain embodiments in accordance with this aspect, the thickness of the first PCB and the thickness of the second PCB are substantially equal, and the first gap distance and the second gap distance are substantially equal.

Another aspect in accordance with the embodiments disclosed herein is a system of interconnected printed circuit boards. The system comprises a first printed circuit board (PCB) having a respective first longitudinal surface and a respective second longitudinal surface. The first PCB has a respective thickness between the respective first longitudinal surface and the respective second longitudinal surface. The first PCB has a respective end surface. The first PCB has at least a respective first mounting pad on the respective first longitudinal surface. The interconnection system further comprises a second PCB having a respective first longitudinal surface and a respective second longitudinal surface. The second PCB has a respective thickness between the respective first longitudinal surface and the respective second longitudinal surface. The second PCB has a respective end surface. The second PCB has at least a respective first mounting pad on the respective first longitudinal surface. The interconnection system further comprises an interconnection device. The interconnection device comprises a support platform having a first longitudinal engagement surface positioned to engage the respective second surface of the first PCB and having a second engagement surface positioned to engage the respective second surface of the second PCB. The interconnection device includes a separator extending from the first engagement surface and from the second engagement surface. The separator has a first separator surface perpendicular to the first engagement surface and has a second separator surface perpendicular to the second engagement surface. The first separator surface and the second separator surface are spaced apart by a separation distance. The first separator surface is positioned to engage the respective end surface of the first PCB. The second separator surface is positioned to engage the respective end surface of the second PCB. The interconnection device further includes at least a first contact pin extending longitudinally through the separator. A first portion of the first contact pin extends from the first separator surface. A second portion of the first contact pin extends from the second separator surface. The first portion of the first contact pin is spaced apart from the first engagement surface by a first gap distance selected to correspond to the respective thickness of the first PCB. The second portion of the first contact pin is spaced apart from the second engagement surface by a second gap distance selected to correspond to the respective thickness of the second PCB. The first portion of the first contact pin is secured to the respective first mounting pad of the first PCB. The second portion of the first contact pin is secured to the respective first mounting pad of the second PCB.

In certain embodiments in accordance with this aspect, the first portion of the first contact pin is secured to the respective first mounting pad of the first PCB with solder, and the second portion of the first contact pin is secured to the respective first mounting pad of the second PCB with solder.

In certain embodiments in accordance with this aspect, the respective thickness of the first PCB and the respective thickness of the second PCB are substantially equal, and the first gap distance is substantially equal to the second gap distance.

In certain embodiments in accordance with this aspect, the first PCB has at least a respective second mounting pad on the respective first longitudinal surface. The respective second mounting pad of the first PCB is parallel to the respective first mounting pad of the first PCB. The second PCB has at least a respective second mounting pad on the respective first longitudinal surface. The respective second mounting pad of the second PCB is parallel to the respective first mounting pad of the second PCB. The interconnection device further includes a second contact pin extending longitudinally through the separator. The second contact pin is parallel to the first contact pin. A first portion of the second contact pin extends from the first separator surface. A second portion of the second contact pin extends from the second separator surface. The first portion of the second contact pin is spaced apart from the first longitudinal engagement surface by the first gap distance. The second portion of the second contact pin spaced apart from the second longitudinal engagement surface by the second gap distance. The first portion of the second contact pin is secured to the respective second mounting pad of the first PCB, and the second portion of the second contact pin secured to the respective second mounting pad of the second PCB. In certain embodiments in accordance with this aspect, the first portion of the first contact pin is secured to the respective first mounting pad of the first PCB with solder, the second portion of the first contact pin is secured to the respective first mounting pad of the second PCB with solder, the first portion of the second contact pin is secured to the respective second mounting pad of the first PCB with solder, and the second portion of the second contact pin is secured to the respective second mounting pad of the second PCB with solder.

In certain embodiments in accordance with this aspect, the respective thickness of the first PCB and the respective thickness of the second PCB are substantially equal, and the first gap distance is substantially equal to the second gap distance.

BRIEF DESCRIPTIONS OF THE SEVERAL VIEWS OF THE DRAWINGS

DETAILED DESCRIPTION

The following detailed description of embodiments of the present disclosure refers to one or more drawings. Each drawing is provided by way of explanation of the present disclosure and is not a limitation. Those skilled in the art will understand that various modifications and variations can be made to the teachings of the present disclosure without departing from the scope of the disclosure. For instance, features illustrated or described as part of one embodiment can be used with another embodiment to yield a still further embodiment.

The present disclosure is intended to cover such modifications and variations as come within the scope of the appended claims and their equivalents. Other objects, features, and aspects of the present disclosure are disclosed in the following detailed description. One of ordinary skill in the art will understand that the present discussion is a description of exemplary embodiments only and is not intended as limiting the broader aspects of the present disclosure.

Figure 1:
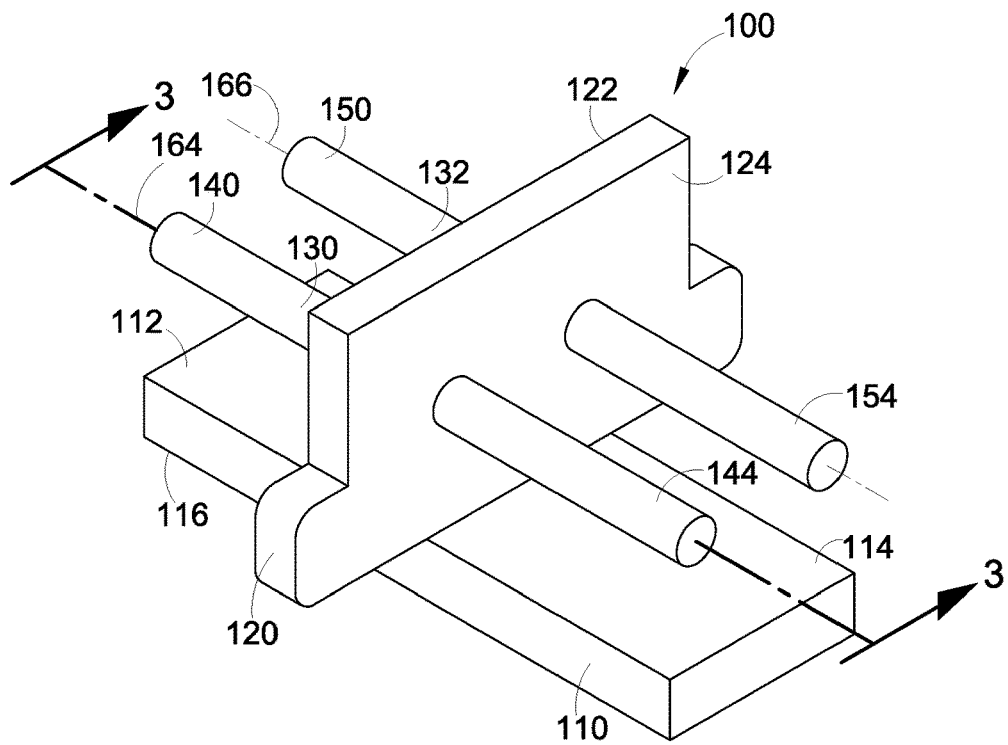
FIG. 1 illustrates a perspective view of an interconnection device.
Figure 2:
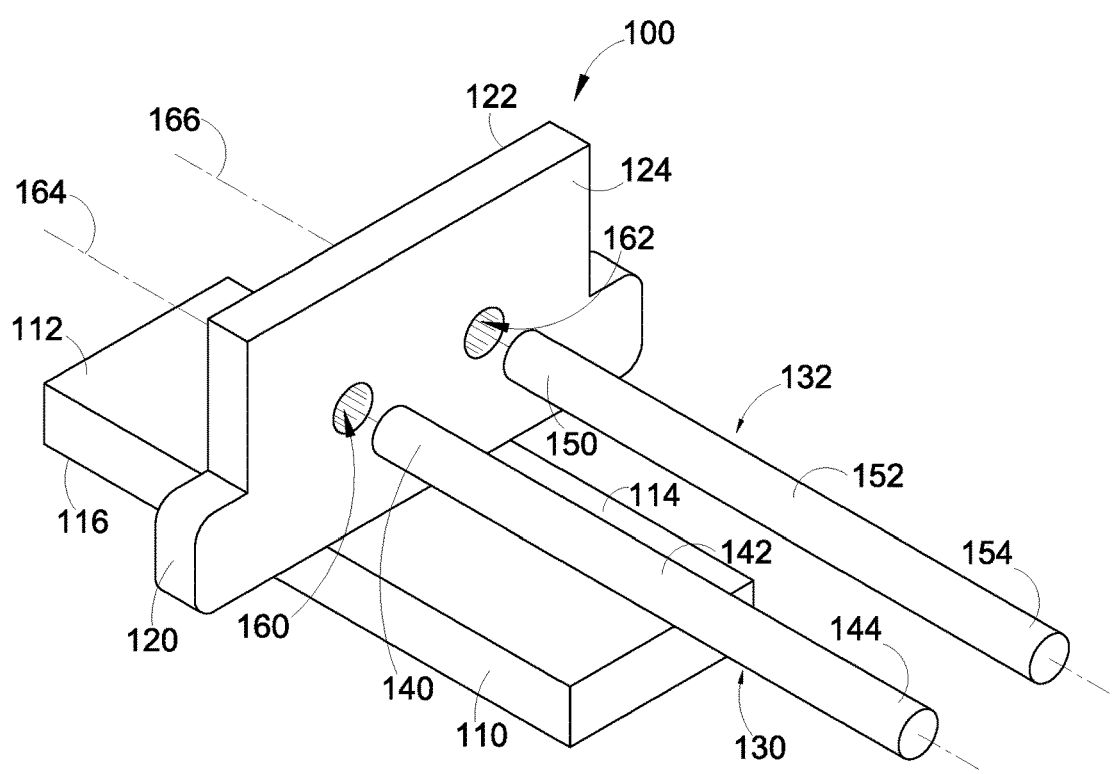
FIG. 2 illustrates an exploded perspective view of the interconnection device showing the first and second bores in the board separator and the first and second contact pins prior to insertion through the bores.
Figure 3:
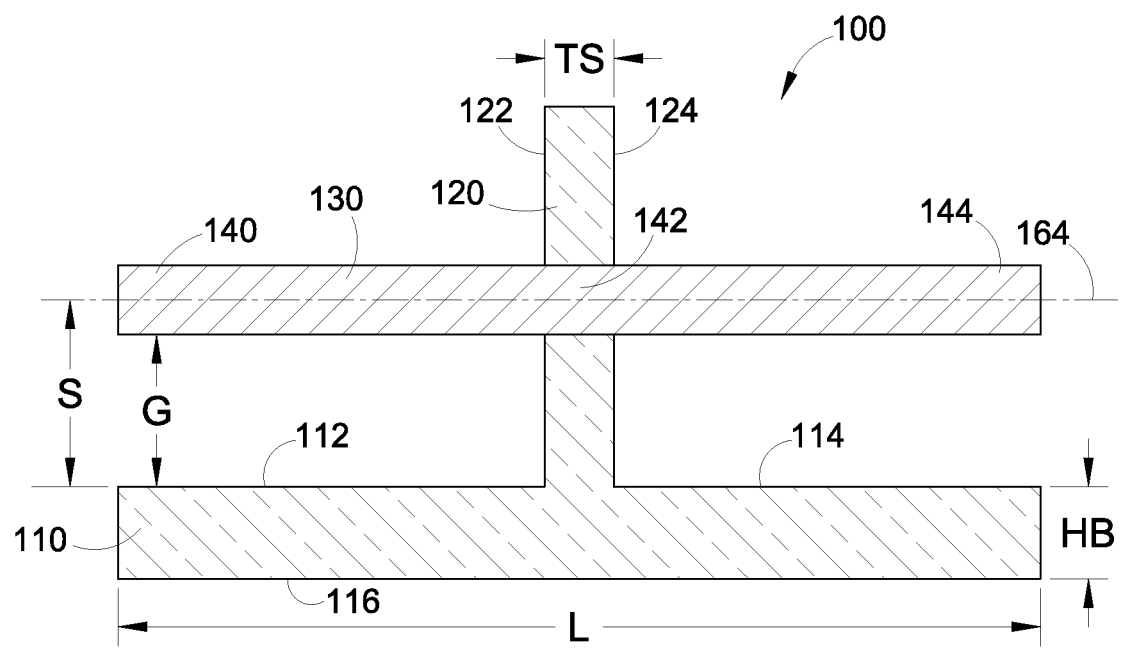
FIG. 3 illustrates a front elevational cross-sectional view of the interconnection device of FIG. 1 taken alone the line 3-3 in FIG. 1.
Figure 4:
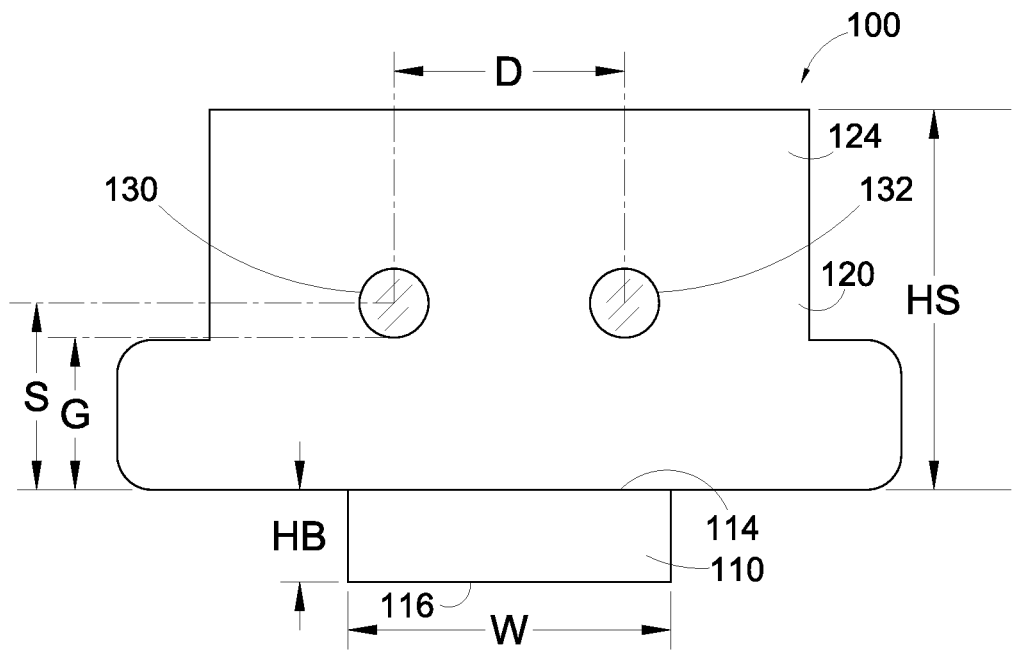
FIG. 4 illustrates a right elevational view of the interconnection device of FIG. 1.

FIG. 1 illustrates a perspective view of a first embodiment of a surface mount technology (SMT) interconnection device 100. FIG. 2 illustrates an exploded perspective view of the interconnection device showing the first and second bores in the board separator and the first and second contact pins prior to insertion through the bores. FIG. 3 illustrates a front elevational cross-sectional view of the interconnection device of FIG. 1. FIG. 4 illustrates a right elevational view of the interconnection device of FIG. 1.

The interconnection device 100 includes a support platform 110 that has a first support (or engagement) surface 112 and a second support (or engagement surface) 114. The support surfaces are oriented longitudinally and spaced apart from a lower surface 116 of the support platform. In the illustrated embodiment, the support platform has a shape of a parallelepiped with a width W of approximately 1.7 inch and a length L of approximately 0.4 inch. In the embodiment of FIGS. 1-4, the support platform has a common thickness height HB from the lower surface to each of first and second support surfaces. In the illustrated embodiment, the height HB is approximately 0.04 inch. The shape and the dimensions are by way of example only. The support platform may have a different shape and may have different dimensions.

The interconnection device 100 further includes a board separator 120 that extends upward from the first support surface 112 and the second support surface 114 of the support platform 110. In the illustrated embodiment, the board separator has a height HS of approximately 1.65 inches. The board separator is positioned approximately in the middle of the support platform and separates the first support surface from the second support surface. In the illustrated embodiment, the board separator has a separator thickness TS of approximately 0.03 inch from a first board separator surface 122 that extends orthogonally from the first support surface to a second board separator surface 124 that extends orthogonally from the second support surface. As discussed below, the separator thickness may be changed to accommodate a desired separation between two printed circuit boards.

In the embodiment of FIGS. 1-4, the board separator 120 supports a first contact pin 130 and a second contact pin 132. The contact pins may comprise a suitable electrically conductive material. For example, in one embodiment, the contact pins comprise brass anodized with a gold outer surface. In the illustrated embodiment, the contact pins have a common diameter of approximately 0.03 inch and a common length of approximately 0.4 inch. Accordingly, the two contact pins are substantially rigid.

As shown in the exploded view of FIG. 4, the first contact pin 130 includes a first extended portion 140, a middle portion 142 and a second extended portion 144. The second contact pin 132 includes a first extended portion 150, a middle portion 152 and a second extended portion 154. The board separator 120 includes a first cylindrical bore 160 to receive and secure the middle portion of the first contact pin and includes a second cylindrical bore 162 to receive and secure the middle portion of the second contact pin. As shown in FIG. 1, the first extended portions of the contact pins extend perpendicularly from the first board separator surface 122 of the board separator. The second extended portions of the contact pins extend perpendicularly from the second board separator surface 124 of the board separator. The first and second bores are aligned with and centered on a respective first axis 164 and a respective second axis 166. The two axes are parallel to the first support surface and are spaced apart longitudinally by a selected center-to-center spacing distance D. In the illustrated embodiment, the spacing distance is approximate 0.1 inch.

The centers of the first bore 160 and the second bore 162, respectively, are spaced apart from the first support surface 112 and the second support surface 114 by a selected spacing distance S such that the closest distance of the outer perimeter of each bore from the first support surface is a selected gap distance G. In the illustrated embodiment, each bore has a diameter of approximately 0.03 inch. Thus, the gap distance G is approximately 0.015 inch less than the spacing distance S. For example, in the illustrated embodiment, the spacing distance S is approximately 0.081 inch, which results in a gap distance G of approximately 0.066 inch. In the illustrated embodiment of FIGS. 1-4, the gap distance G is common to both the first support surface and the second support surface.

In the illustrated embodiment, the support platform 110 and the board separator 120 of the interconnection device 100 are formed as a single molded unit (e.g., by injection molding or the like). The first contact pin 130 and the second contact pin 132 can be positioned and secured in the board separator as part of the injection molding process. Alternatively, the first bore 160 and the second bore 162 can be formed in the board separator during the injection molding process. The first contact pin and the second contact pin can be press-fit into the two bores after the interconnection device is released from the injection molding apparatus.

Figure 5:
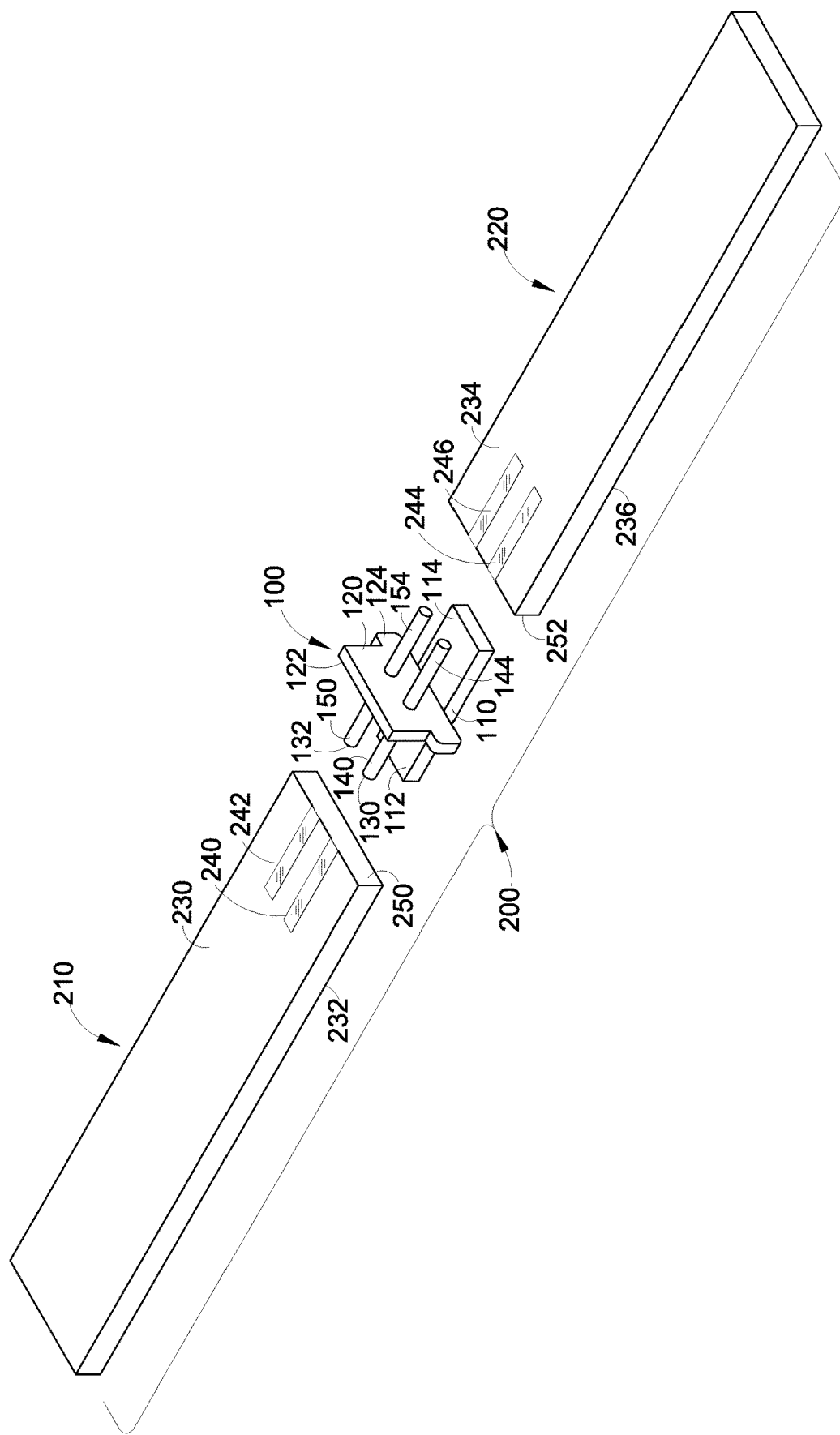
FIG. 5 illustrates a perspective view of a first printed circuit board (PCB) and a second PCB prior to interconnection of the two PCBs using the interconnection device of FIG. 1.
Figure 6:
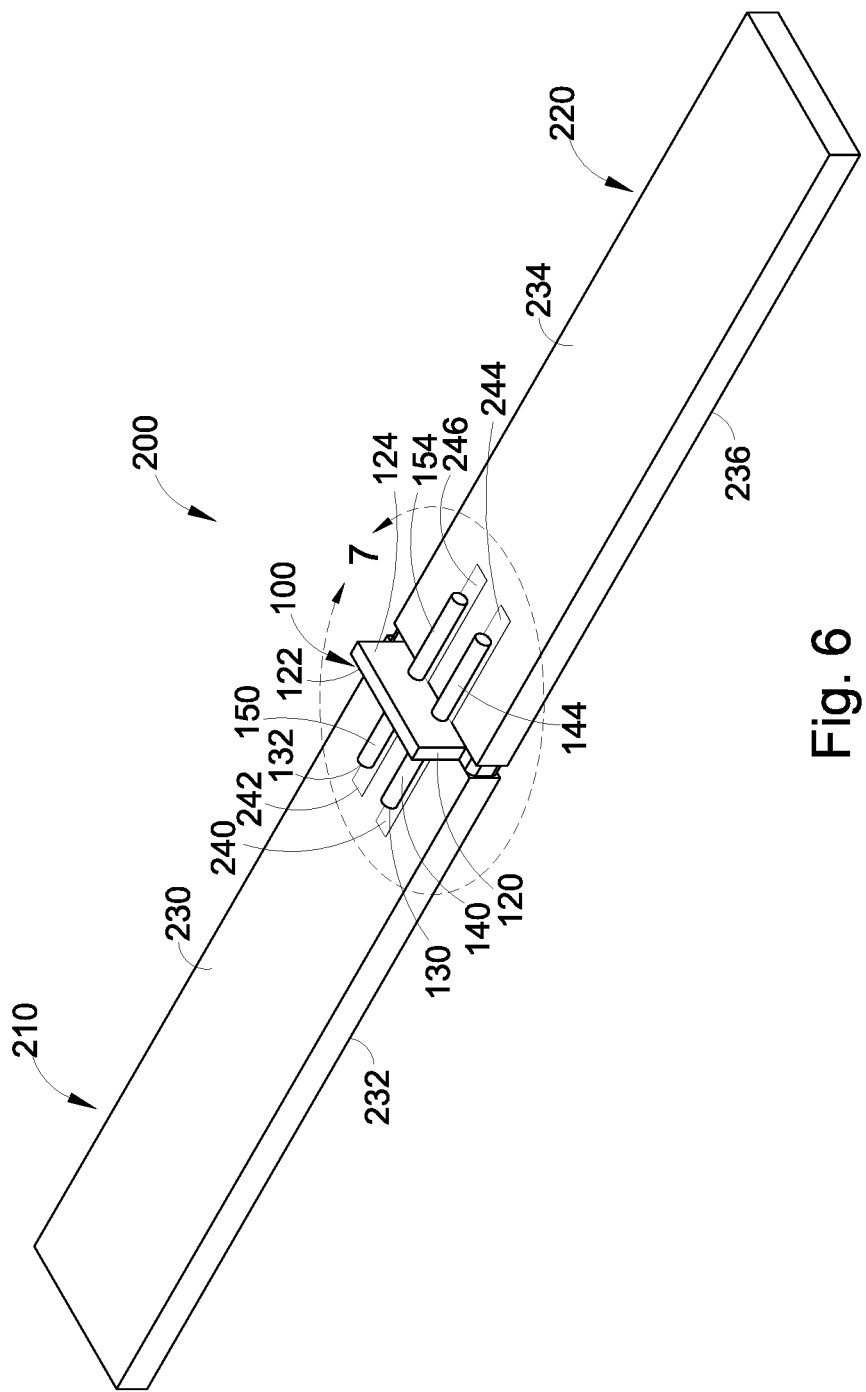
FIG. 6 illustrates a perspective view of the first and second PCBs of FIG. 5 interconnected using the interconnection device of FIG. 1.

FIGS. 5 and 6 illustrate perspective views of a system 200 comprising the interconnection device 100 of FIGS. 1-4, a first printed circuit board (PCB) 210 and a second PCB 220. FIG. 5 illustrates the system prior to interconnection of the two PCBs using the interconnection device. The interconnection device is shown positioned between the two PCBs. FIG. 6 illustrates the system with the two PCBs interconnected using the interconnection device.

In the illustrated embodiment, the first PCB 210 and the second PCB 220 have conventional structures. For example, each PCB may comprise one or more interconnection layers (not shown) between a respective top surface and a respective bottom surface. The first PCB has a top surface 230 and a bottom surface 232. The second PCB has a top surface 234 and a bottom surface 236. The top surface of each PCB may include mounting pads (not shown) to receive and secure electronic components and interconnection traces (not shown) between mounting pads.

In the illustrated embodiment of FIG. 5, the first PCB 210 includes a respective first pin-receiving mounting pad 240 and a respective second pin-receiving mounting pad 242 on the top surface 230. The second PCB 220 includes a respective first pin-receiving mounting pad 244 and a respective second pin-receiving mounting pad 246 on the top surface 234. Each pin-receiving mounting pad on the top surface of the first PCB extends perpendicularly from a board edge 250. Each pin-receiving mounting pad on the top surface of the second PCB extends perpendicularly from a board edge 252. Each pin-receiving mounting pad has length of approximately 0.2 inch to 0.25 inch. Each pin-receiving mounting pad has a width of approximately 0.03 inch to 0.04 inch. The thickness of each pin-receiving mounting pad corresponds to the thickness of other mounting pads and interconnection traces on the first PCB and the second PCB. For example, in one embodiment, the thickness of the copper layer forming the conductive traces and the mounting pads is approximately 1.37 mils (0.00137 inch). The thickness of each PCB may vary depending on, for example, the number of layers. In the illustrated embodiment of FIGS. 5 and 6, each PCB has a thickness of approximately 0.065 inch.

The first pin-receiving mounting pad 240 and the second pin-receiving mounting pad 242 of the first PCB 210 are mutually parallel and are spaced apart by a center-to-center distance selected to correspond to the center-to-center spacing D of the first contact pin 130 and the second contact pin 132 of the interconnection device 100 (e.g., approximately 0.1 inch in the illustrated embodiment). The first pin-receiving mounting pad 244 and the second pin-receiving mounting pad 246 of the second PCB 220 are also mutually parallel and are spaced apart for a corresponding center-to-center spacing (e.g., approximately 0.1 inch).

Figure 7:
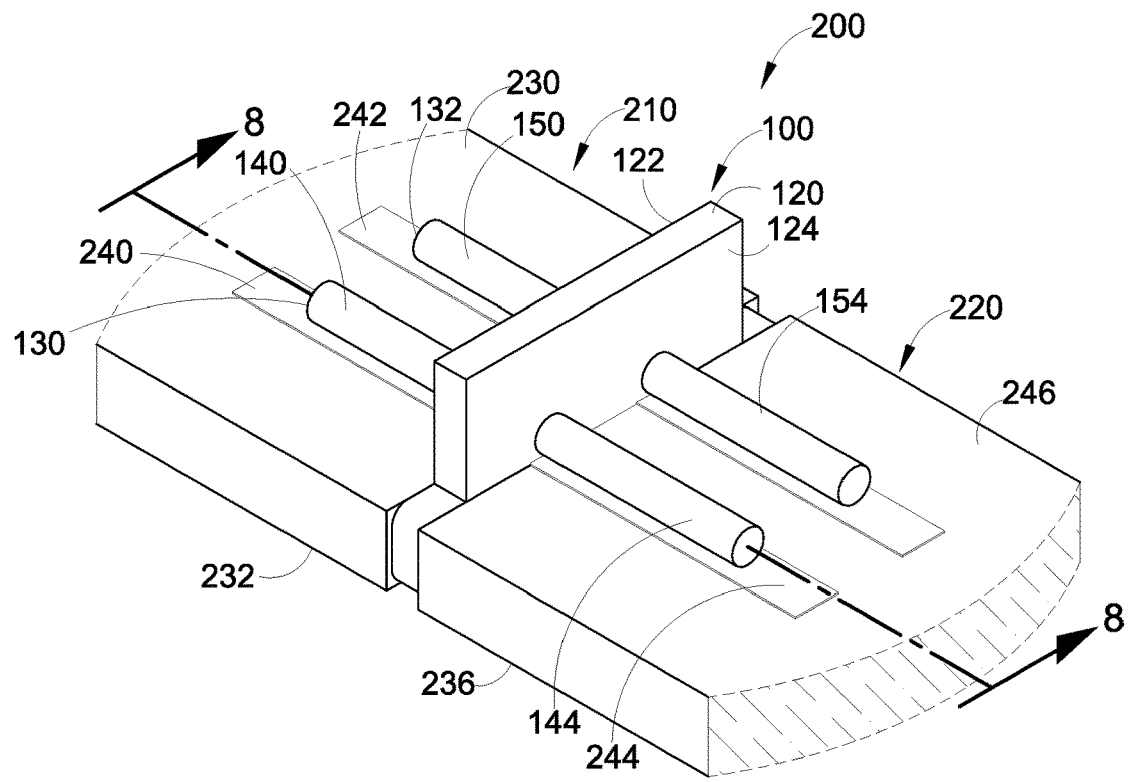
FIG. 7 illustrates a partial perspective view of the first and second PCBs and the interconnection device of FIG. 6 taken within the area 7 of FIG. 6.
Figure 8:
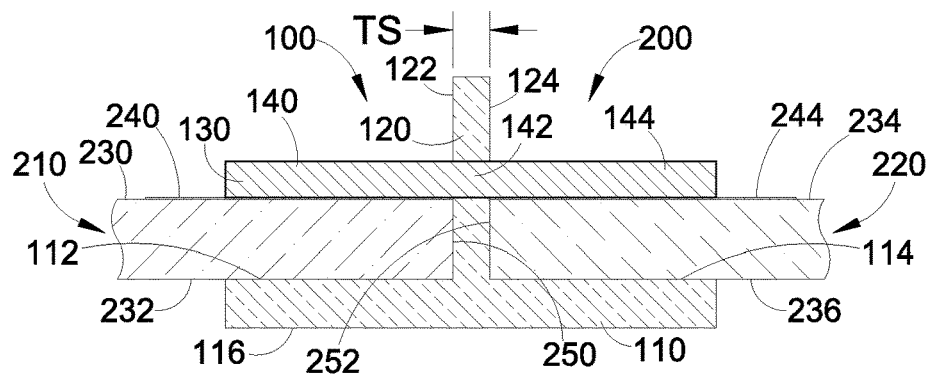
FIG. 8 illustrates a cross-sectional view of the first and second PCBs and the interconnection device of FIG. 6 taken along the line 8-8 in FIG. 7.

FIG. 6 illustrates a perspective view of the first PCB 210 and the second PCB 220 of FIG. 5 interconnected using the interconnection device 100 of FIG. 1. FIG. 7 illustrates a partial perspective view of the first and second PCBs and the interconnection device of FIG. 6 taken within the area 7 of FIG. 6. The two PCBs are positioned with the first pin-receiving mounting pad 240 of the first PCB aligned with the first pin-receiving mounting pad 244 of the second PCB. The second pin-receiving mounting pad 242 of the first PCB is aligned with the second pin-receiving mounting pad 246 of the second PCB. The interconnection device is positioned such that the first support surface 112 of the support platform 110 (FIG. 8) is engaged with the bottom surface 232 of the first PCB. The second support surface 114 is engaged with the bottom surface 236 of the second PCB. The board edge 250 of the first PCB is engaged with the first board separator surface 122 of the board separator 120. The board edge 252 of the second PCB is engaged with the second board separator surface 124 of the board separator. Thus, the two board edges are spaced apart by the thickness T of the board separator (e.g., approximately 0.03 inch in the illustrated embodiment).

Figure 9:
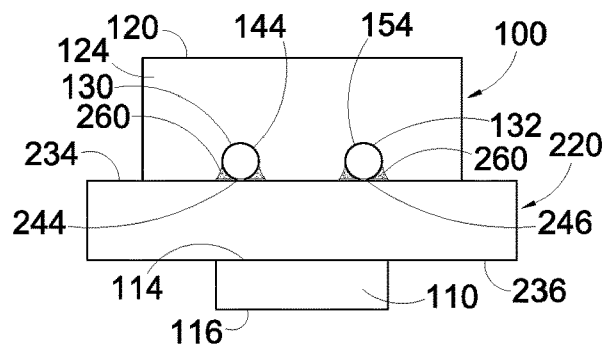
FIG. 9 illustrates a right end view of the interconnected PCBs of FIG. 6 showing the solder securing the contact pins to the pin-receiving mounting pads.

As further illustrated in FIG. 6, the interconnection device 100 is positioned such that the first extended portion 140 of the first contact pin 130 is aligned with the first pin-receiving mounting pad 240 of the first PCB 210. The first extended portion 150 of the second contact pin 132 aligned with the second pin-receiving mounting pad 242 of the first PCB. The second extended portion 144 of the first contact pin is aligned with the first pin-receiving mounting pad 244 of the second PCB 220. The second extended portion 154 of the second contact pin is aligned with the second pin-receiving mounting pad 246 of the second PCB. The aligned contact pins are electrically and mechanically secured to the respective pin-receiving mounting pads by soldering or another suitable interconnection technique. FIG. 9 illustrates solder 260 securing the contact pins to the pin-receiving mounting pads. The tight fit of the two PCBs between the support surfaces 112, 114 of the support platform 110 maintains the positions of the contact pins against the pin-receiving mounting pads during the soldering or other interconnection process. The size and configuration of the interconnection device enables the device to be positioned and soldered using SMT manufacturing techniques.

When the two contact pins 130, 132 are secured to the four pin-receiving mounting pads 240, 242, 244, 246, the two PCBs 210, 220 are electrically connected together via the conductive contact pins. Furthermore, the two PCBs are held in a fixed spatial relationship because of the interconnected contact pins. The positioning of the PCBs between the rigid contact pins and the support surfaces 112, 114 of the support platform 110 inhibits the PCBs from moving with respect to each other, thus avoiding undue pressure against the soldered connections between the contact pins and the pin-receiving mounting pads.

Figure 10:
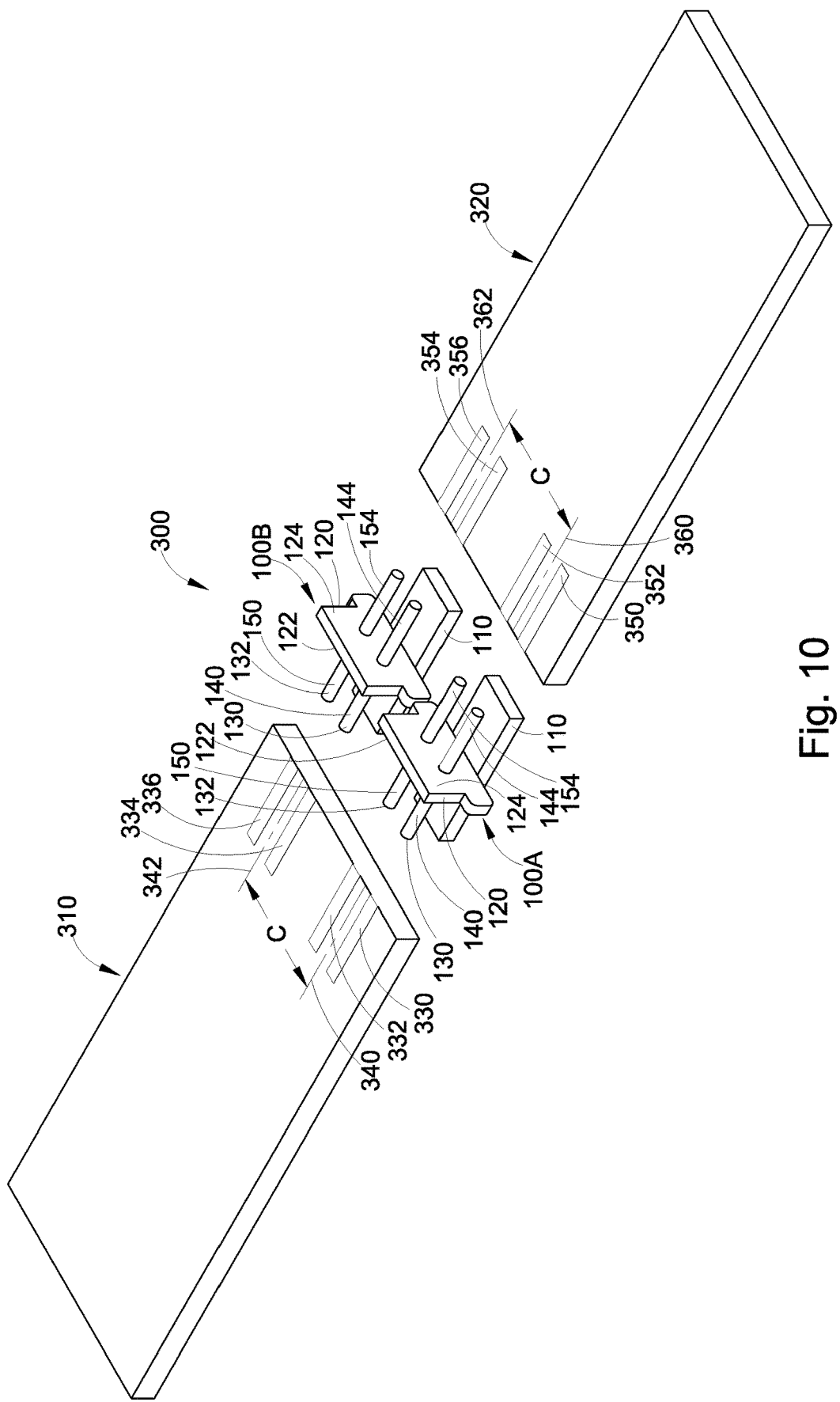
FIG. 10 illustrates a perspective view of a first PCB and a second PCB to be interconnected using a first interconnection device of FIG. 1 and a second interconnection device of FIG. 1.
Figure 11:
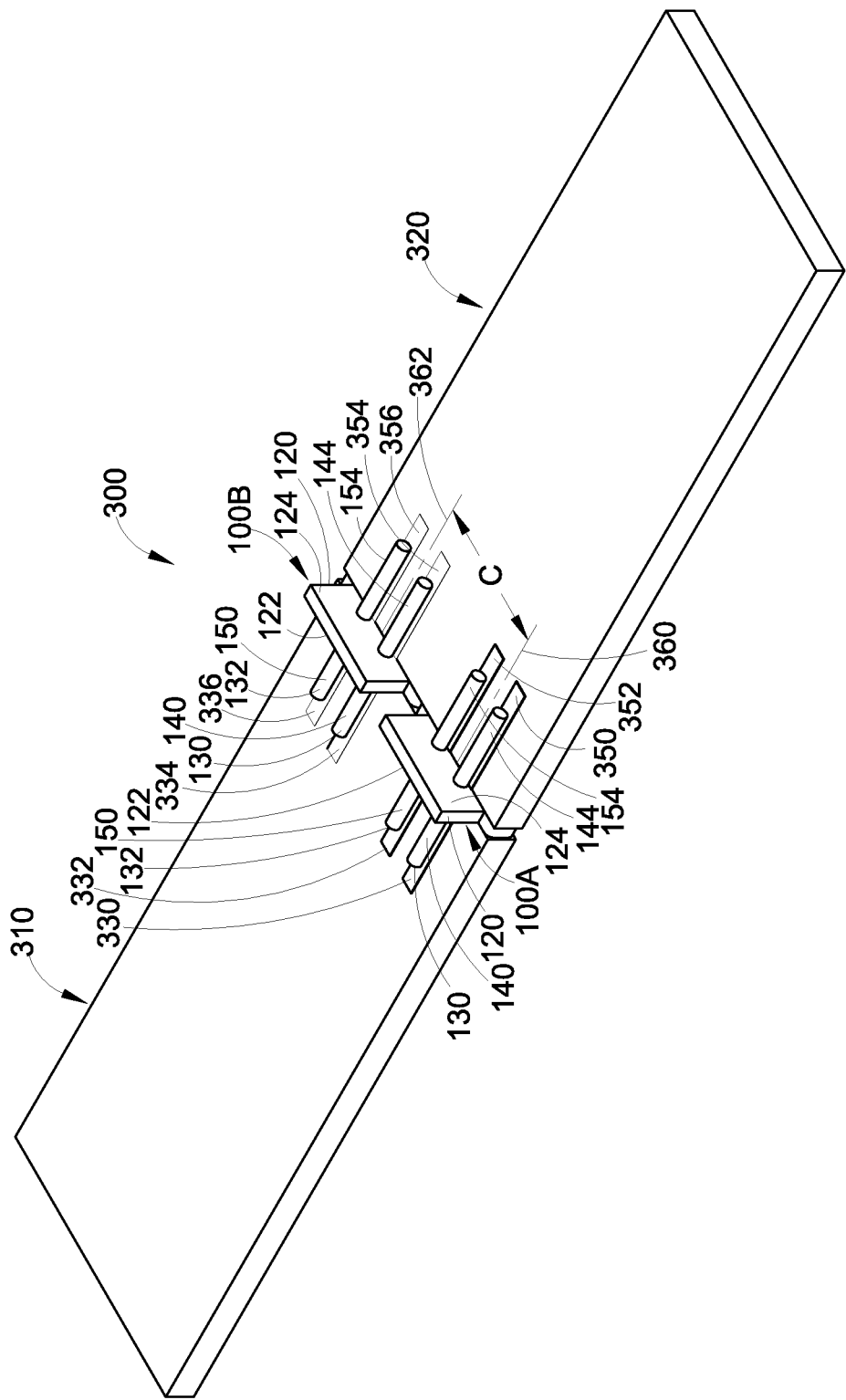
FIG. 11 illustrates a perspective view of the first and second PCBs and the first and second interconnection devices when aligned and interconnected.

If additional connections between two PCBs are needed or if additional structural interconnection between two PCBs is wanted, more than one interconnection device can be used to interconnect two PCBs. For example, FIGS. 10 and 11 illustrate a perspective view of a system 300 having a first PCB 310 and a second PCB 320 interconnected using a first interconnection device 100A and a second interconnection device 100B. In the illustrated embodiment of FIGS. 10 and 11, each interconnection device corresponds to the interconnection device 100 of FIG. 1. The elements of the first and second interconnection devices are numbered as previously described.

As illustrated in FIG. 10, the first PCB 310 includes a respective first pin-receiving mounting pad 330 and a respective second pin-receiving mounting pad 332. The first and second pin-receiving mounting pads are spaced apart from center to center by approximately 0.1 inch to correspond to the center-to-center spacing of the two contact pins 130, 132 of the first interconnection device 100A. The first PCB further includes a respective third pin-receiving mounting pad 334 and a respective fourth pin-receiving mounting pad 336, which are also spaced apart by the corresponding center-to-center spacing of the contact pins of the second interconnection device 100B. A centerline 340 between the first and second pin-receiving mounting pads is spaced apart from a centerline 342 between the third and fourth pin-receiving mounting pads by a selected distance C.

As further illustrated in FIG. 10, the second PCB 320 includes a respective first pin-receiving mounting pad 350 and a respective second pin-receiving mounting pad 352. The first and second pin-receiving mounting pads are spaced apart from center to center by the corresponding center-to-center spacing of the contact pins of the first interconnection device 100A. The second PCB further includes a respective third pin-receiving mounting pad 354 and a respective fourth pin-receiving mounting pad 356, which are also spaced apart by the corresponding center-to-center spacing of the contact pins of the second interconnection device 100B. A centerline 360 between the first and second pin-receiving mounting pads of the second PCB is spaced apart from a centerline 362 between the third and fourth pin-receiving mounting pads of the second PCB by the selected distance C.

As illustrated in FIG. 11, the first interconnection device 100A and the second interconnection device 100B are positioned on the first PCB 310 and the second PCB 320 as described above with respect to FIG. 6. The two interconnection devices are spaced apart center to center by the selected distance C.

The first extended portion 140 of the first contact pin 130 of the first interconnection device 100A is aligned with the first pin-receiving mounting pad 330 of the first PCB 310. The first extended portion 150 of the second contact pin 132 of the first interconnection device is aligned with the second pin-receiving mounting pad 332 of the first PCB. The second extended portion 144 of the first contact pin of the first interconnection device is aligned with the first pin-receiving mounting pad 350 of the second PCB 320. The second extended portion 154 of the second contact pin of the first interconnection device is aligned with the second pin-receiving mounting pad 352 of the second PCB. The extended portions of the contact pins of the first interconnection device are secured to the respective pin-receiving mounting pads of the two PCBs by soldering or other suitable technique as described above.

The first extended portion 140 of the first contact pin 130 of the second interconnection device 100B is aligned with the third pin-receiving mounting pad 334 of the first PCB 310. The first extended portion 150 of the second contact pin 132 of the second interconnection device is aligned with the fourth pin-receiving mounting pad 336 of the first PCB. The second extended portion 144 of the first contact pin of the second interconnection device is aligned with the third pin-receiving mounting pad 354 of the second PCB 320. The second extended portion 154 of the second contact pin of the second interconnection device is aligned with the fourth pin-receiving mounting pad 356 of the second PCB. The extended portions of the contact pins of the second interconnection device are secured to the respective pin-receiving mounting pads of the two PCBs by soldering or other suitable technique as described above.

In the illustrated embodiments of FIGS. 1-9 and 10-11, the first PCB and the second PCB in each system have the same or substantially the same board thicknesses. In some systems, the two PCBs to be connected may have different thicknesses.

Figure 12:
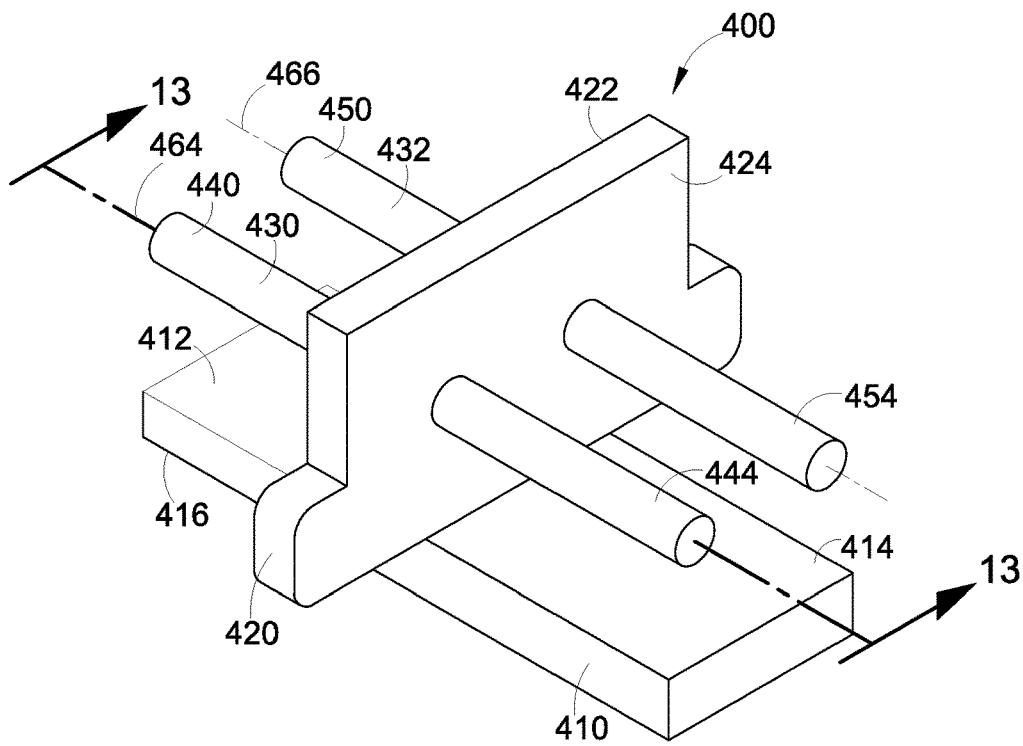
FIG. 12 illustrates a perspective view of a modified interconnection device in which a first support surface is spaced apart from the contact pin by a gap first distance and a second support surface is spaced apart from the contact pin by a second gap distance.

FIG. 12 illustrates a perspective view of a modified interconnection device 400 having a support platform 410. The support platform has a first support (or engagement) surface 412 and a second support (or engagement) surface 414. The support platform has a first height (thickness) HB1 between a lower surface 416 and the first support surface and has a second height HB2 between the lower surface and the second support surface.

The modified interconnection device 400 includes a board separator 420 extending perpendicularly to the support platform 410. The board separator has a first board separator surface 422 extending from the first support surface 412 and has a second board separator surface 424 extending from the second support surface 414. The two board separator surfaces are spaced apart by a thickness TS as described above. In the illustrated embodiment, the first and second board separator surfaces have the height HS as described above.

The board separator 420 supports a first contact pin 430 and a second contact pin 432 that correspond to the previously described first and second contact pins 130, 132. The first contact pin has a respective first extended portion 440, a respective middle portion 442 (FIG. 13) and a respective second extended portion 444. The second contact pin has a respective first extended portion 450, a respective middle portion (not shown) and a respective second extended portion 454.

Figure 13:
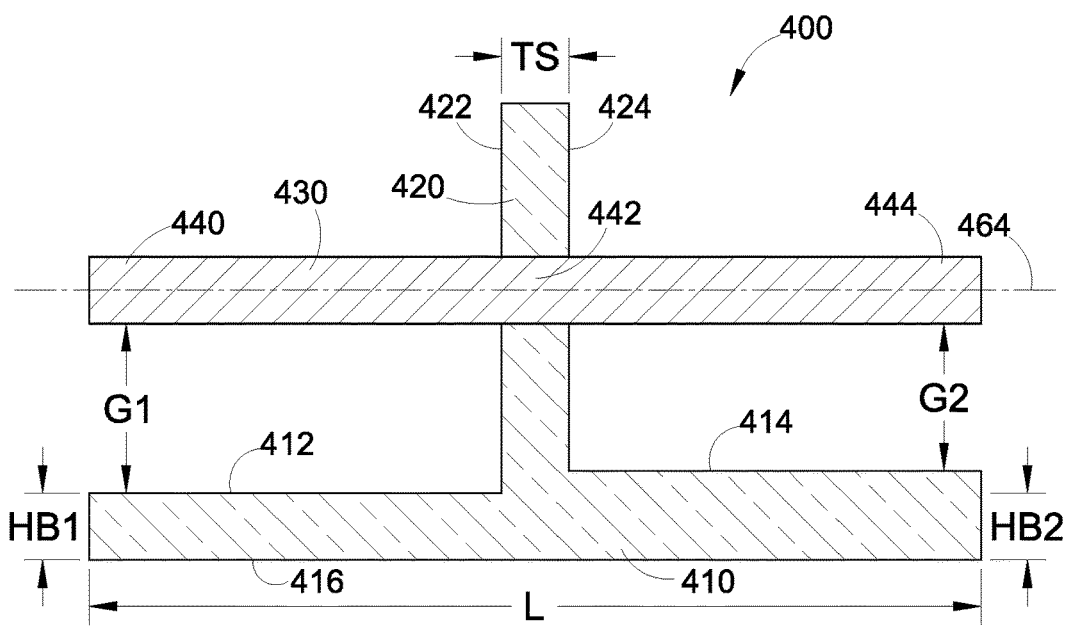
FIG. 13 illustrates a front elevational cross-sectional view of the modified interconnection device of FIG. 11 showing the first gap distance G1 and the second gap distance G2.

As shown in the cross-sectional view of FIG. 13, the first extended portion 440 of the first contact pin 430 is spaced apart from the first support surface 412 of the support platform 410 by a first gap G1. The second extended portion 444 of the first contact pin is spaced apart from the second support surface 414 of the support platform by a second gap G2. The corresponding first and second extended portions 450, 452 (FIG. 12) of the second contact pin 432 are also spaced apart from the first and second support surfaces by respective corresponding gaps G1 and G2. In the illustrated embodiment, the height HB1 of the support platform from the lower surface 416 to the first support surface is shorter than the height HB2 of the support platform from the bottom surface to the second support surface. Thus, the first gap G1 is greater than the second gap G2. The first contact pin is aligned along a first centerline 464. The second contact pin is aligned along a second centerline 466.

Figure 14:
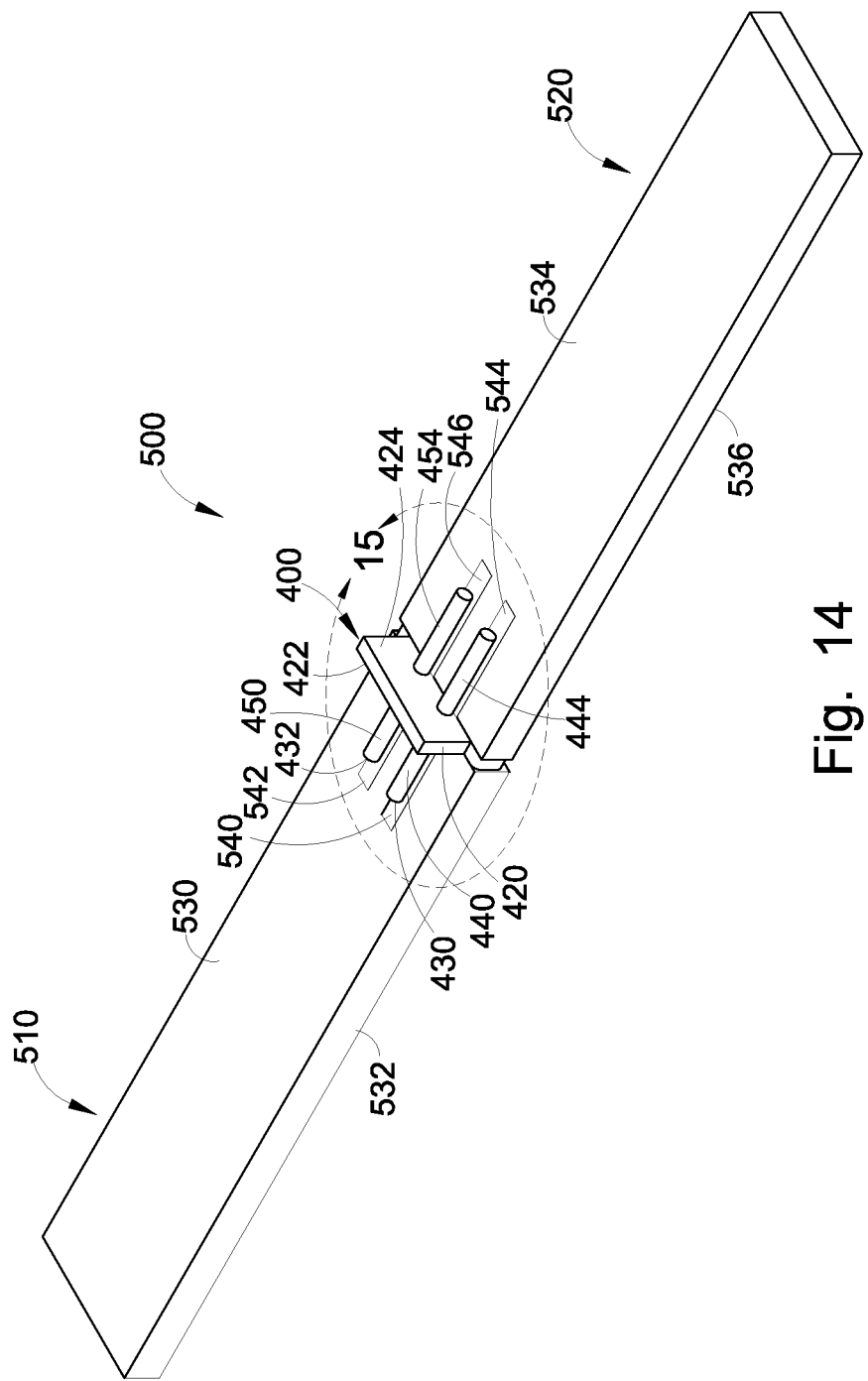
FIG. 14 illustrates a perspective view of a first PCB and a second PCB interconnected using the modified interconnection device of FIGS. 12 and 13, wherein the first PCB has a board thickness corresponding to the first gap distance G1 and the second PCB has a board thickness corresponding to the second gap distance G2.
Figure 15:
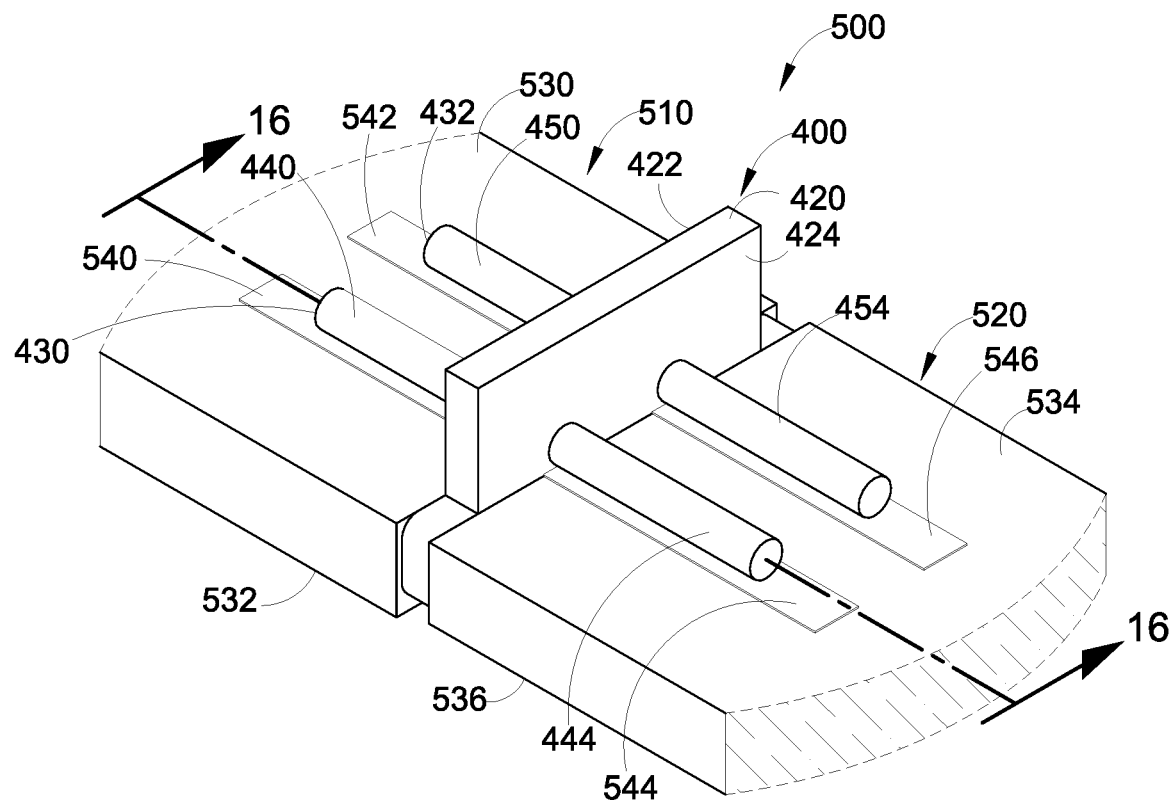
FIG. 15 illustrates a partial perspective view of the first and second PCBs and the interconnection device of FIG. 14 taken within the area 15 of FIG. 14.
Figure 16:
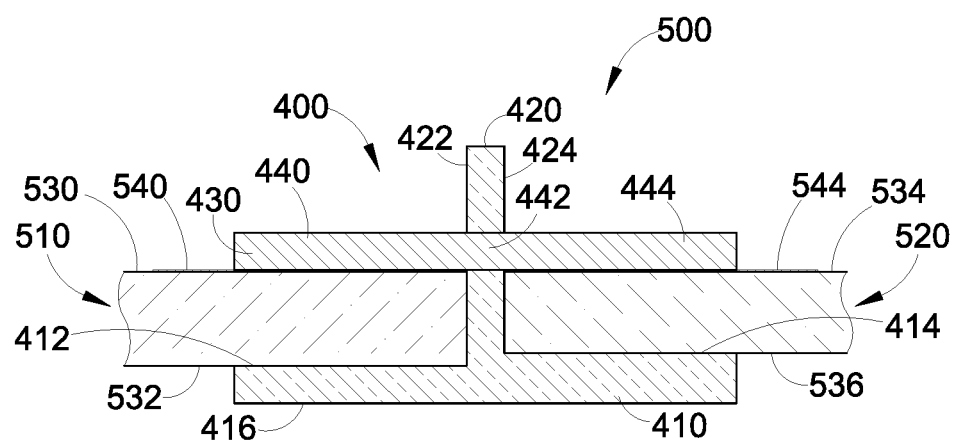
FIG. 16 illustrates a front elevational cross-sectional view of the first and second PCBs and the modified interconnection device of FIG. 13 taken along the line 14-14 in FIG. 13.

FIG. 14 illustrates a perspective view of a system 500 comprising a first PCB 510 and a second PCB 520 interconnected using the modified interconnection device 400 of FIGS. 12 and 13. FIG. 15 illustrates a partial perspective view of the first and second PCBs and the interconnection device of FIG. 14 taken within the area 15 of FIG. 14. FIG. 16 illustrates a cross-sectional view of the fifth and sixth PCBs and the system of FIG. 14 taken along the line 16-16 in FIG. 15. The first PCB has a board thickness from a respective upper surface 530 to a respective lower surface 532 corresponding to the first gap distance G1 (FIG. 13). The second PCB has a board thickness from a respective upper surface 534 to a respective lower surface 536 corresponding to the second gap distance G2 (FIG. 13). The first PCB has a first pin-receiving mounting pad 540 and a second pin-receiving mounting pad 542. The second PCB has first pin-receiving mounting pad 544 and a second pin-receiving mounting pad 546.

When the first PCB 510 and the second PCB 520 are interconnected using the modified interconnection device 400, the first PCB is positioned securely between the first support surface 412 of the support platform 410 and the first extended portions 440, 450 of the contact pins 430, 432. The second PCB is positioned securely between the second support surface 414 of the support platform and the second extended portions 444, 454 of the contact pins.

When the modified interconnection device 400 is positioned with the contact pins aligned with the pin-receiving mounting pads, the first extended portion 440 of the first contact pin 430 is soldered or otherwise secured to the first pin-receiving mounting pad 540 of the first PCB 510. The second extended portion 444 of the first contact pin is secured to the first pin-receiving mounting pad 544 of the second PCB 520. The first extended portion 450 of the second contact pin 432 is secured to the second pin-receiving mounting pad 542 of the first PCB. The second extended portion 454 of the second contact pin is secured go the second pin-receiving mounting pad 546 of the second PCB.

Figure 17:
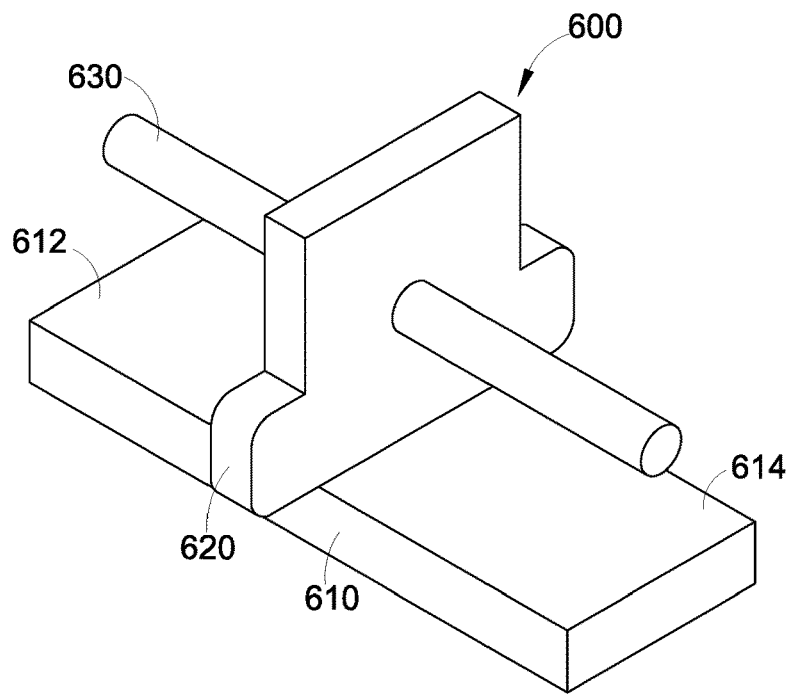
FIG. 17 illustrates a perspective view of another modified interconnection device having a single contact pin.

The interconnection device disclosed herein may have other configurations. For example, FIG. 17 illustrates a perspective view of a modified interconnection device 600 having a single contact pin. The interconnection device includes a support platform 610 having a first support surface 612 and a second support surface 614. The first and second support surfaces are spaced apart from a common lower surface 616. A board separator 620 extends perpendicularly from the first and second support surfaces. The board separator includes a first board separator surface 622 and a second board separator surface 624 as previously described. A single contact pin 630 extends through the board separator and is spaced apart from the first and second support surfaces as described above. The interconnection device of FIG. 17 electrically and mechanically interconnects first and second PCBs (not shown) by soldering or otherwise securing the contact pin to a single pin-receiving mounting pad (not shown) on each of the PCBs.

Figure 18:
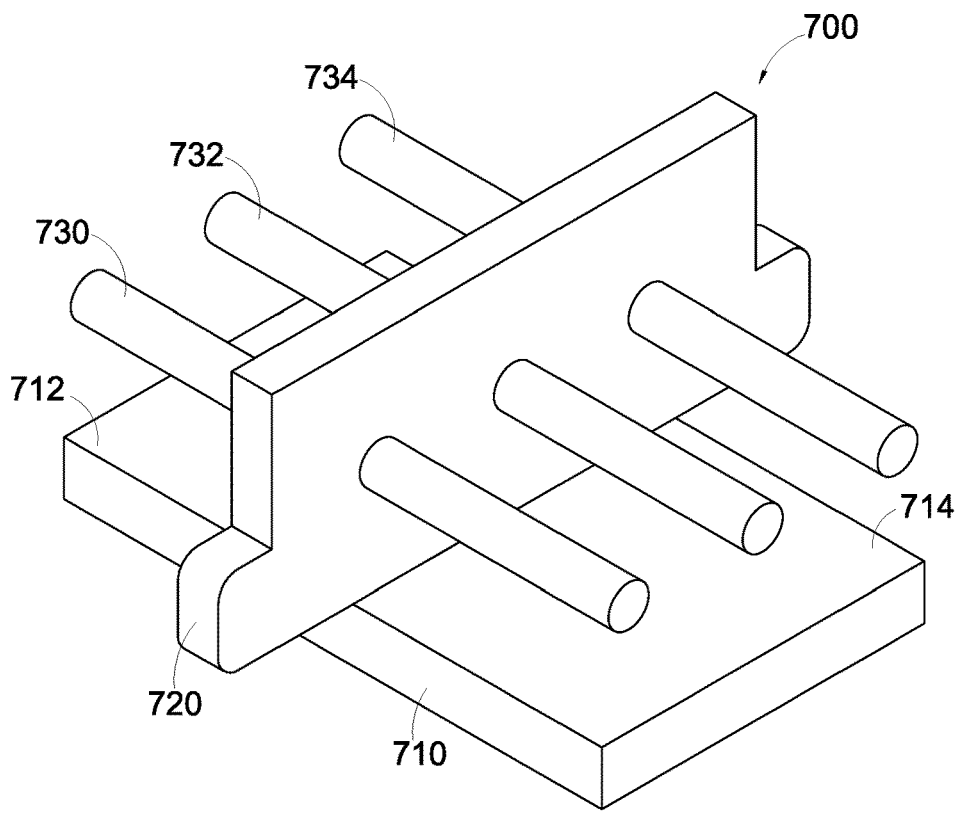
FIG. 18 illustrates a perspective view of another modified interconnection device having three contact pins.

FIG. 18 illustrates a perspective view of another modified interconnection device 700 having three contact pins. The interconnection device includes a support platform 710 having a first support surface 712 and a second support surface 714. A board separator 720 extends perpendicularly from the first and second support surfaces. The board separator includes a first board separator surface 722 and a second board separator surface 724 as previously described. A first contact pin 730, a second contact pin 732 and a third contact pin 734 extend through the board separator. The three contact pins are spaced apart from the first and second support surfaces as described above. The interconnection device of FIG. 18 electrically and mechanically interconnects first and second PCBs (not shown) by soldering or otherwise securing the three contact pins to three respective pin-receiving mounting pads (not shown) on each of the PCBs.

Figure 19:
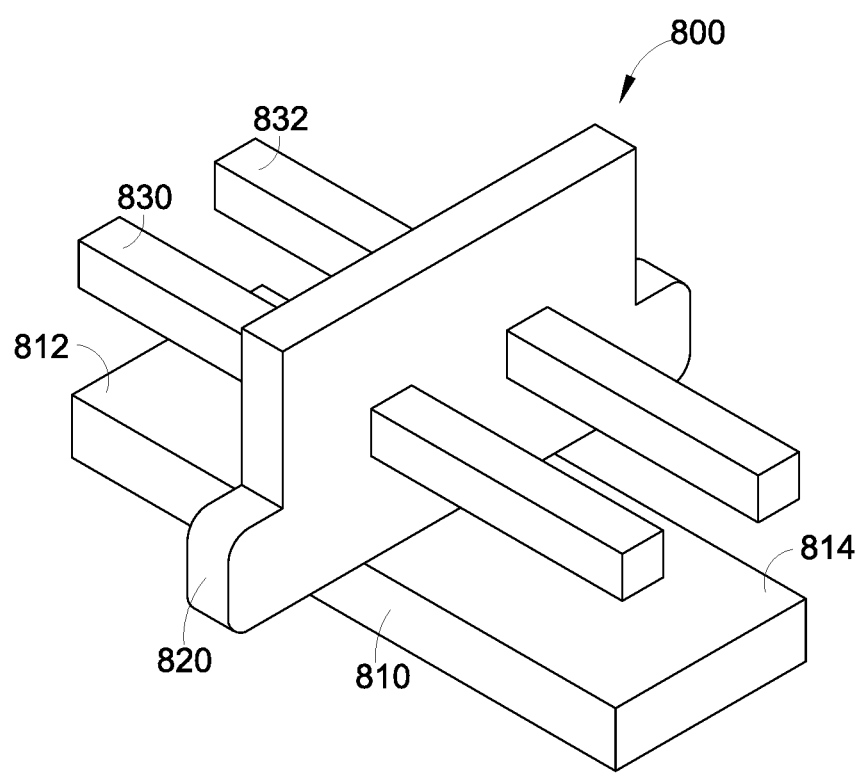
FIG. 19 illustrates a perspective view of another modified interconnection device having contact pins with a rectangular (e.g., square) profile.

FIG. 19 illustrates a perspective view of another modified interconnection device 800 having contact pins with a rectangular (e.g., square) profile. The interconnection device includes a support platform 810 having a first support surface 812 and a second support surface 814. A board separator 820 extends perpendicularly from the first and second support surfaces. The board separator includes a first board separator surface 822 and a second board separator surface 824 as previously described. A first contact pin 830 and a second contact pin 832 extend through the board separator and are spaced apart from the first and second support surfaces as described above. The interconnection device of FIG. 19 electrically and mechanically interconnects first and second PCBs (not shown) by soldering or otherwise securing the two contact pins to respective pin-receiving mounting pads (not shown) on each of the PCBs.

Additional embodiments having additional contact pins or having different spacings between contact pins are envisioned. For example, when two or more interconnection devices are used to interconnect two PCBs, at least one of the interconnection devices may have a different number of connector pins than another interconnection device.

The interconnection devices are described herein as providing electrical and mechanical interconnects between two PCBs. In many configurations, a contact pin of an interconnection device electrically interconnects electrical power, a voltage reference (e.g., ground) or a signal between the PCBs. In certain configurations, one or more contact pins may be used as described above to only mechanically interconnect the PCBs.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. An interconnection device to connect a first printed circuit board (PCB) to a second PCB, each PCB having a respective first surface and a respective second surface, each PCB having a respective thickness between the respective first surface and the respective second surface, the interconnection device comprising:
    a support platform having a first engagement surface configured to engage the second surface of the first PCB and having a second engagement surface configured to engage the second surface of the second PCB;
    a separator extending from the first engagement surface and from the second engagement surface, the separator having a first separator surface perpendicular to the first engagement surface and having a second separator surface perpendicular to the second engagement surface, the first separator surface and the second separator surface spaced apart by a separation distance; and
    at least a first contact pin extending longitudinally through the separator, a respective first portion of the first contact pin extending from the first separator surface, a respective second portion of the first contact pin extending from the second separator surface, the respective first portion of the first contact pin spaced apart from the first engagement surface by a first gap distance selected to correspond to the respective thickness of the first PCB, the respective second portion of the first contact pin spaced apart from the second engagement surface by a second gap distance selected to correspond to the respective thickness of the second PCB.

2. The interconnection device as defined in claim 1, further comprising a second contact pin extending longitudinally through the separator, the second contact pin parallel to the first contact pin, a respective first portion of the second contact pin extending from the first separator surface, a respective second portion of the second contact pin extending from the second separator surface, the respective first portion of the second contact pin spaced apart from the first engagement surface by the first gap distance, the respective second portion of the second contact pin spaced apart from the second engagement surface by the second gap distance.

3. The interconnection device as defined in claim 1, wherein the thickness of the first PCB and the thickness of the second PCB are substantially equal, and the first gap distance and the second gap distance are substantially equal.

4. A system of interconnected printed circuit boards comprising:
    a first printed circuit board (PCB) having a respective first longitudinal surface and a respective second longitudinal surface, the first PCB having a respective thickness between the respective first longitudinal surface and the respective second longitudinal surface, the first PCB having a respective end surface, the first PCB having at least a respective first mounting pad on the respective first longitudinal surface;
    a second PCB having a respective first longitudinal surface and a respective second longitudinal surface, the second PCB having a respective thickness between the respective first longitudinal surface and the respective second longitudinal surface, the second PCB having a respective end surface, the second PCB having at least a respective first mounting pad on the respective first longitudinal surface; and
    an interconnection device comprising:
        a support platform having a first longitudinal engagement surface positioned to engage the respective second surface of the first PCB and having a second engagement surface positioned to engage the respective second surface of the second PCB;
        a separator extending from the first engagement surface and from the second engagement surface, the separator having a first separator surface perpendicular to the first engagement surface and having a second separator surface perpendicular to the second engagement surface, the first separator surface and the second separator surface spaced apart by a separation distance, the first separator surface positioned to engage the respective end surface of the first PCB, the second separator surface positioned to engage the respective end surface of the second PCB; and
        at least a first contact pin extending longitudinally through the separator, a first portion of the first contact pin extending from the first separator surface, a second portion of the first contact pin extending from the second separator surface, the first portion of the first contact pin spaced apart from the first engagement surface by a first gap distance selected to correspond to the respective thickness of the first PCB, the second portion of the first contact pin spaced apart from the second engagement surface by a second gap distance selected to correspond to the respective thickness of the second PCB, the first portion of the first contact pin secured to the respective first mounting pad of the first PCB, the second portion of the first contact pin secured to the respective first mounting pad of the second PCB.

5. The system as defined in claim 4, wherein:
    the first portion of the first contact pin is secured to the respective first mounting pad of the first PCB with solder; and
    the second portion of the first contact pin is secured to the respective first mounting pad of the second PCB with solder.

6. The system as defined in claim 4, wherein:
the respective thickness of the first PCB and the respective thickness of the second PCB are substantially equal; and
the first gap distance is substantially equal to the second gap distance.

7. The system as defined in claim 4, wherein:
the first PCB has at least a respective second mounting pad on the respective first longitudinal surface, the respective second mounting pad of the first PCB parallel to the respective first mounting pad of the first PCB;
the second PCB has at least a respective second mounting pad on the respective first longitudinal surface, the respective second mounting pad of the second PCB parallel to the respective first mounting pad of the second PCB,
the interconnection device further includes a second contact pin extending longitudinally through the separator, the second contact pin parallel to the first contact pin, a first portion of the second contact pin extending from the first separator surface, a second portion of the second contact pin extending from the second separator surface, the first portion of the second contact pin spaced apart from the first longitudinal engagement surface by the first gap distance, the second portion of the second contact pin spaced apart from the second longitudinal engagement surface by the second gap distance; and
the first portion of the second contact pin is secured to the respective second mounting pad of the first PCB, and the second portion of the second contact pin secured to the respective second mounting pad of the second PCB.

8. The system as defined in claim 7, wherein:
the first portion of the first contact pin is secured to the respective first mounting pad of the first PCB with solder;
the second portion of the first contact pin is secured to the respective first mounting pad of the second PCB with solder;
the first portion of the second contact pin is secured to the respective second mounting pad of the first PCB with solder; and
the second portion of the second contact pin is secured to the respective second mounting pad of the second PCB with solder.

9. The system as defined in claim 7, wherein:
the respective thickness of the first PCB and the respective thickness of the second PCB are substantially equal; and
the first gap distance is substantially equal to the second gap distance.

10. A method of interconnecting a first printed circuit board (PCB) and a second PCB, each PCB having a respective first surface, a respective second surface and a respective thickness between the respective first surface and the respective second surface, the method comprising:
positioning a separator of an interconnection device between the first PCB and the second PCB, the separator having a longitudinal thickness selected to space the first PCB and the second PCB apart longitudinally by a selected spacing distance, the separator extending perpendicularly from a first longitudinal engagement surface and a second longitudinal engagement surface, the separator supporting at least a first contact pin extending longitudinally through the separator, the first contact pin having a respective first portion spaced apart from the first longitudinal engagement surface by a first gap distance selected to correspond to the respective thickness of the first PCB and having a respective second portion spaced apart from the second longitudinal engagement surface by a second gap distance selected to correspond to the respective thickness of the second PCB;
positioning the first longitudinal engagement surface against the respective second surface of the first PCB with a respective portion of the first PCB positioned between the respective first portion of the first contact pin and the first longitudinal engagement surface of the separator;
positioning the second longitudinal engagement surface against the respective second surface of the second PCB with a respective portion of the second PCB positioned between the respective second portion of the first contact pin and the second longitudinal engagement surface of the separator;
securing the respective first portion of the first contact pin to a respective first mounting pad on the respective first surface of the first PCB; and
securing the respective second portion of the first contact pin to a respective first mounting pad on the respective first surface of the second PCB.

11. The method as defined in claim 10, wherein:
the respective first portion of the first contact pin is secured to the respective first mounting pad of the first PCB by soldering; and
the respective second portion of the first contact pin is secured to the respective first mounting pad of the second PCB by soldering.

12. The method as defined in claim 10, wherein:
the respective thickness of the first PCB and the respective thickness of the second PCB are substantially equal; and
the first gap distance is substantially equal to the second gap distance.

13. The method as defined in claim 10, wherein:
the separator supports a second contact pin extending longitudinally through the separator, the second contact pin parallel to the first contact pin, the second contact pin having a respective first portion spaced apart from the first longitudinal engagement surface by the first gap distance and having a respective second portion spaced apart from the second longitudinal engagement surface by the second gap distance; and
the method further includes:
  securing the respective first portion of the second contact pin to a respective second mounting pad on the respective first surface of the first PCB; and
  securing the respective second portion of the second contact pin to a respective second mounting pad on the respective first surface of the second PCB.

14. The method as defined in claim 13, wherein:
the respective first portion of the second contact pin is secured to the respective second mounting pad of the first PCB by soldering; and
the respective second portion of the second contact pin is secured to the respective second mounting pad of the second PCB by soldering.

15. The method as defined in claim 13, wherein:
the respective thickness of the first PCB and the respective thickness of the second PCB are substantially equal; and
the first gap distance is substantially equal to the second gap distance.

* * * * *